US008067888B2

(12) United States Patent
Wu

(10) Patent No.: US 8,067,888 B2
(45) Date of Patent: Nov. 29, 2011

(54) ORGANIC LIGHT-EMITTING DIODE DISPLAY DEVICE

(75) Inventor: Wen Hao Wu, ChuNan (TW)

(73) Assignee: Chimei Innolux Corporation, Chu-Nan (TW)

( * ) Notice: Subject to any disclaimer, the term of this patent is extended or adjusted under 35 U.S.C. 154(b) by 345 days.

(21) Appl. No.: 12/391,196

(22) Filed: Feb. 23, 2009

(65) Prior Publication Data

US 2009/0224662 A1 Sep. 10, 2009

(30) Foreign Application Priority Data

Mar. 4, 2008 (TW) .............................. 97107469 A

(51) Int. Cl.
*H01L 27/32* (2006.01)
*H01L 27/28* (2006.01)

(52) U.S. Cl. ............... 313/504; 313/498; 313/512

(58) Field of Classification Search .......... 313/498–512; 428/917; 345/169; 445/23–25
See application file for complete search history.

(56) References Cited

U.S. PATENT DOCUMENTS

| 6,411,019 | B1 | 6/2002 | Hofstra et al. | |
|---|---|---|---|---|
| 6,429,451 | B1 | 8/2002 | Hung et al. | |
| 6,750,609 | B2 | 6/2004 | Aziz et al. | |
| 2004/0051447 | A1* | 3/2004 | Okinaka et al. | 313/504 |
| 2005/0231101 | A1* | 10/2005 | Chen | 313/504 |
| 2006/0113898 | A1* | 6/2006 | Toyoda | 313/504 |
| 2008/0106192 | A1* | 5/2008 | Koo et al. | 313/504 |
| 2009/0302744 | A1* | 12/2009 | Kim et al. | 313/504 |

* cited by examiner

*Primary Examiner* — Joseph L Williams
*Assistant Examiner* — Nathaniel Lee
(74) *Attorney, Agent, or Firm* — Liu & Liu

(57) ABSTRACT

This invention provides an organic light-emitting diode (OLED) display device, in which a plurality of electro-luminescent units is sandwiched between a light reflective layer with an aperture array and a micro-lens array. A light absorbing layer is adjacent to a surface of the light reflective layer opposite to the electro-luminescent units. The ambient light entering the display can be focused to the apertures and directly projected unto the light absorbing layer to eliminate the ambient light. The contrast of the organic light-emitting diode display device is improved.

20 Claims, 5 Drawing Sheets

Ambient Light

ORGANIC LIGHT-EMITTING DIODE DISPLAY DEVICE

BACKGROUND OF THE INVENTION

1. Field of the Invention

The present invention relates to an organic light-emitting diode (OLED) display device.

2. Description of the Related Art

The ambient light is known to have a negative impact on the visual effect of an organic light-emitting diode display device, and the ambient light elimination design of the prior art mainly relies on adding a light absorbing layer to the display device to reduce the reflection of the incident ambient light and increase the contrast of the display device. Though the design can partially reduce the ambient light, some of the light radiated from the organic light-emitting diode device is eliminated as well. Consequently, the contrast of the display device cannot be improved significantly to enhance the visual effect.

FIG. 5A is a schematic cross-sectional view of a conventional organic light-emitting diode display device with a top-emitting surface that comprises, from bottom to top, a bottom substrate 501, a light absorbing layer 502 located on the bottom substrate 501, a reflective electrode layer 503 located on the light absorbing layer 502, an organic luminescent layer 504 located on the reflective electrode layer 503, a transparent electrode layer 505 and a transparent top substrate 506. The transparent electrode layer 505 is under the transparent top substrate 506. As the ambient light enters the display device from the top, some of the ambient light will penetrate the reflective electrode layer 503 and be absorbed by the light absorbing layer 502, thus the amount of the reflected ambient light will be less than that of the incident ambient light.

FIG. 5B is a schematic cross-sectional view of a conventional organic light-emitting diode display device with a bottom-emitting surface that comprises, from bottom to top, a transparent bottom substrate 511, a transparent electrode layer 512 located on the transparent bottom substrate 511, an organic luminescent layer 513 located on the transparent electrode layer 512, a reflective electrode layer 514 located on the organic luminescent layer 513, a light absorbing layer 515 and a top substrate 516. The light absorbing layer 515 is under the top substrate 516. When the ambient light enters the display device from the bottom, some of ambient light will penetrate the reflective electrode layer 514 and be absorbed by the light absorbing layer 515, thus the amount of the reflected ambient light will be less than that of the incident ambient light.

As described above, the light-absorbing layer 502 or 515 can partially absorb both the incident ambient light and the light radiated from the organic luminescent layer 504 or 513, thus the luminescent efficiency of the organic luminescent layer 504 or 513 will be lowered. Though the light absorbing layer 502 or 515 can reduce the negative impact caused by the ambient light, it also absorbs some of the light radiated from the organic luminescent layer 504 or 513. Consequently, the contrast of the display device cannot be significantly increased to improve the visual effect.

SUMMARY OF THE INVENTION

The present invention aims to provide an organic light-emitting diode display device that controls an incident position of ambient light, allowing the ambient light to be projected to and absorbed substantially by a light absorbing layer inside the display device to increase a contrast of the display device.

The present invention provides an organic light-emitting diode display device including a first substrate, a second substrate separated from the first substrate by a gap, a buffer layer filled in the gap between the two substrates, a light absorbing layer adjacent to a surface of the second substrate opposite to the first substrate, a light reflective layer with an aperture array comprising a plurality of apertures located on a surface of the light absorbing layer opposite to the first substrate, a plurality of electro-luminescent units located on a surface of the light reflective layer with an aperture array opposite to the light absorbing layer, an electrode layer with first electrical conductive type located on the electro-luminescent units and a micro-lens array comprising a plurality of micro lenses located on a surface of the second substrate opposite to the first substrate.

In one aspect of the present invention, the light reflective layer with an aperture array of the present organic light-emitting diode display device that features an ambient light elimination design has an electrical conductivity opposite to that of the electrode layer.

In another aspect of the present invention, the organic light-emitting diode display device of the present invention includes an electrode layer with a second electrical conductive type, which is located between the light reflective layer with an aperture array and the electro-luminescent units, and the electrical conductivity of said electrode layer with said first electrical conductive type is opposite to the electrical conductivity of said electrical layer with said second electrical conductive type.

The present invention enables the ambient light entering the display device to be focused to the apertures of the light reflective layer with an aperture array and then projected to the light absorbing layer for absorption.

The purposes or features of the present invention will be described more fully hereinafter with reference to the accompanying drawings, in which preferred embodiments of the invention are shown. It is to be understood that the accompanying drawings and embodiments are provided so that this disclosure will fully convey the scope of the invention, and this invention should not be construed as limited to the embodiments set forth herein.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

To address the disadvantages of the prior art, the present invention adds a micro-lens array to an organic light-emitting diode display device and equips a reflective electrode layer with an aperture array to ensure that the incident ambient light can be substantially absorbed by a light absorbing layer in the display device to eradicate the negative impact caused by the ambient light.

Figure 2A:
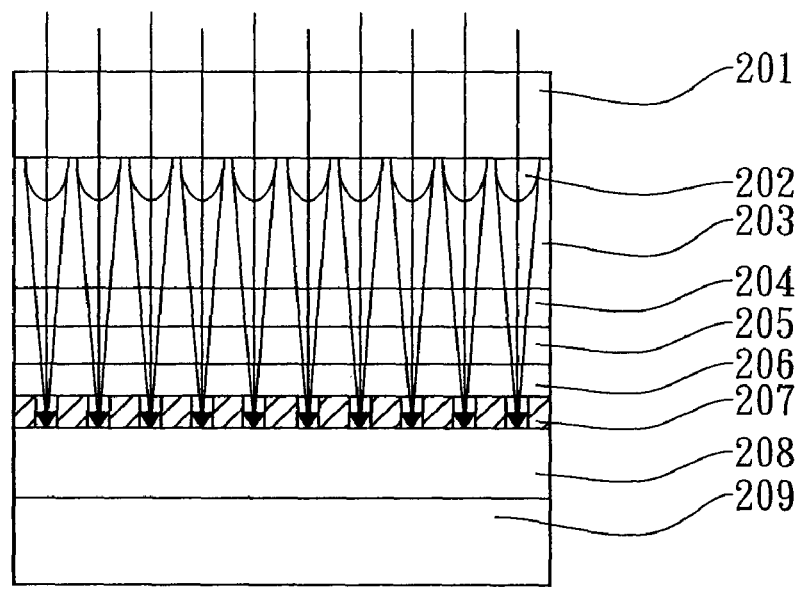
FIG. 2A is a schematic cross-sectional view showing a structure of an organic light-emitting diode display device with a top-emitting surface according to a first embodiment of the present invention, wherein the function of the ambient light emission mechanism is demonstrated.

FIG. 2A is a schematic cross-sectional view showing a partial structure of an organic light-emitting diode display device with a top-emitting surface 3 according to a first embodiment of the present invention. According to the first embodiment of the present invention, the organic light-emitting diode display device, from top to bottom, includes a top substrate 201, a micro-lens array 202, a buffer layer 203, an electrode layer 204 of a first electrical conductive type, a plurality of electro-luminescent units 205, an electrode layer 206 with a second electrical conductive type, a light reflective layer 207 with an aperture array, a light absorbing layer 208 and a bottom substrate 209. There is a gap between the bottom substrate 209 and the top substrate 201, which could be a glass substrate or a color filter, and the buffer layer 203 filled in the gap could be made of acrylic resin, epoxy resin or silicon. The micro-lens array 202 is located under the top substrate 201, and each organic light-emitting diode unit includes a plurality of micro lenses. A refractive index of the micro-lens array 20 that ranges from 1.65 to 2.0 is higher than that of the buffer layer 203 that ranges from 1.5 to 1.6.

The electrode layer 204 of a first electrical conductive type, which is transparent and is located on the electro-luminescent units 205, could be a cathode layer or an anode layer. The light absorbing layer 208 is located on the bottom substrate 209 could be made of black resin or molybdenum oxide (MoOx). The light reflective layer 207 with an aperture array located on the light absorbing layer 208 could be a second electrical conductive type or no electrical conductivity, wherein electrical conductive of the first electrical conductive type is opposite to the electrical conductive of the second electrical conductive type. When the light reflective layer 207 with an aperture array is electrical conductive, the electrode layer 206 with a second electrical conductive type could be omitted. Moreover, the apertures of the aperture array are paired with the micro lenses of the micro-lens array 202, that is, each aperture is aligned with a corresponding micro lens so that the light penetrating the micro lenses can be focused to the apertures. The light reflective layer 207 with an aperture array could be an aluminum (Al) layer or an aluminum-neodymium (AlNd) layer of a second electrical conductive type.

Figure 2B:
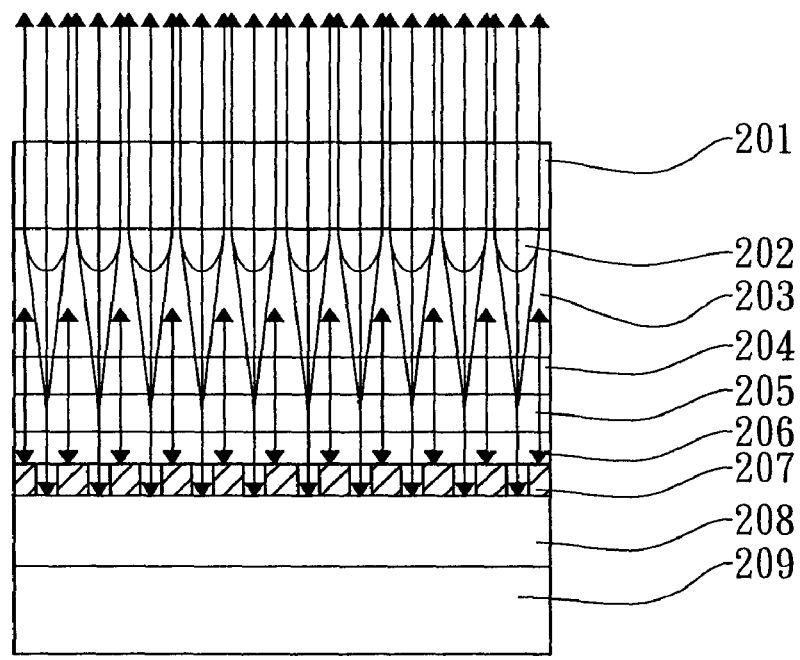
FIG. 2B is a schematic cross-sectional view showing the structure of the organic light-emitting diode display device with a top-emitting surface according to the first embodiment of the present invention and demonstrates that the micro-lens array can direct the light radiated from the display device to the same direction.
Figure 2C:
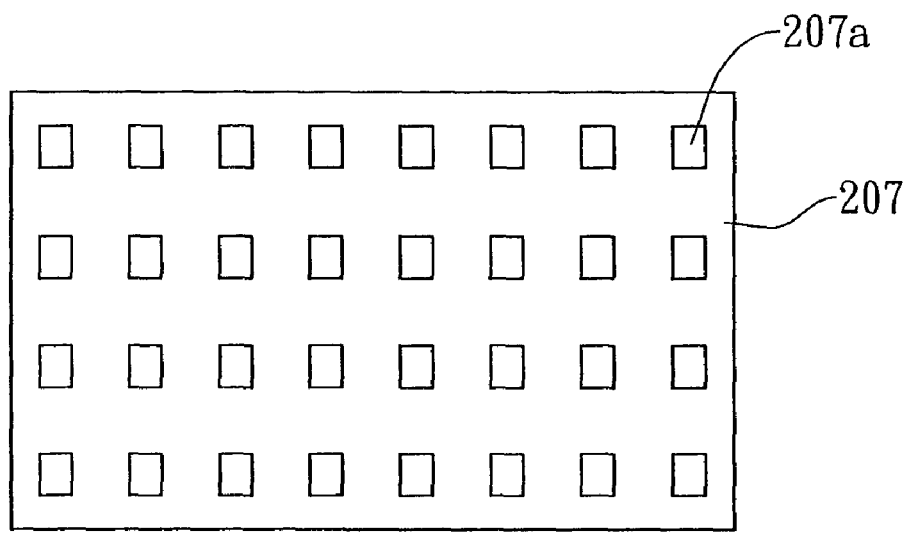
FIG. 2C is a schematic top view of the light reflective layer with an aperture array according to the first embodiment of the present invention.

FIG. 2C is a schematic top view of the light reflective layer 207 with an aperture array that comprises a plurality of apertures 207a. The electrode layer 206 with a second electrical conductive type, which is transparent and located on the light reflective layer 207 with an aperture array, could be an (ITO) electrode layer. The electro-luminescent units 205 are located on the electrode layer 206 with a second electrical conductive type.

Referring to FIG. 2A, when the ambient light enters the display device from the top, it is preferable that each micro lens is 2~5 μm in diameter and 5~6 μm in height, each light aperture 207a 3 μm in diameter and the gap between the top substrate 201 and the bottom substrate 209 7~10 μm preferably within the focal length of each micro lens so that the ambient light penetrating each micro lens can be focused to its corresponding aperture 207a. As described above, the incident ambient light penetrating the micro-lens array 203 can be focused to the apertures 207a and substantially absorbed by the light absorbing layer 208 to increase the contrast of the display device.

FIG. 2B is used to demonstrate that the micro-lens array 203 installed in the organic light-emitting diode display device, wherein the micro-lens array 203 can also direct the light radiated from the top-emitting surface of the electro-luminescent units 205 to the same direction to increase the luminescent intensity of the electro-luminescent units 205 and improve the contrast of the display device.

Figure 3:
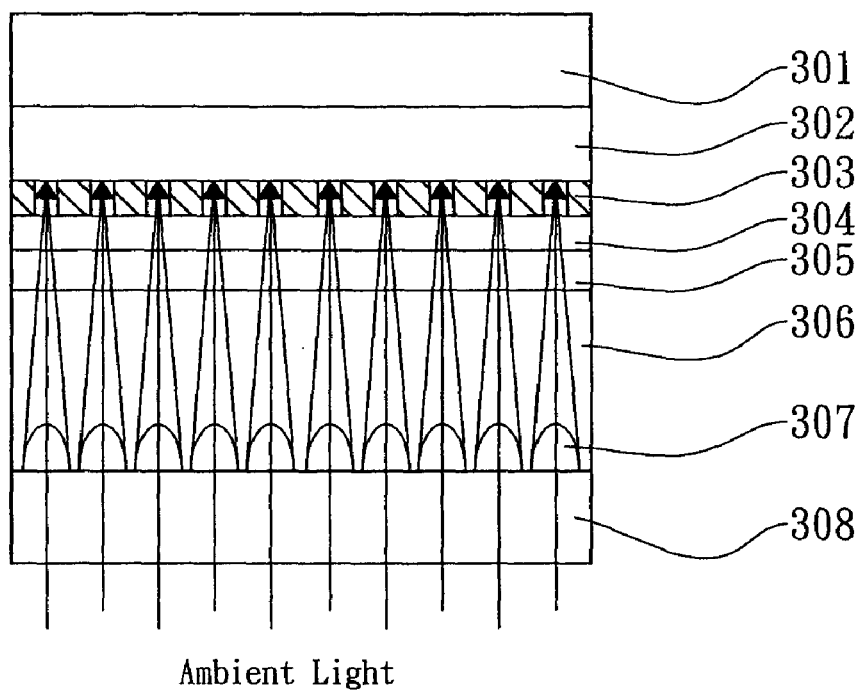
FIG. 3 is a schematic cross-sectional view that shows a structure of an organic light-emitting diode display device with a bottom-emitting surface according to a second embodiment of the present invention and demonstrates the function of the ambient light emission mechanism.

FIG. 3 is a schematic cross-sectional view of a partial structure of an organic light-emitting diode display device with a bottom-emitting surface according to a second embodiment of the present invention. According to the second embodiment of the present invention, the organic light-emitting diode display device having the ambient light elimination design comprises, from top to bottom, a top substrate 301, a light absorbing layer 302, a light reflective layer 303 with an aperture array, a plurality of electro-luminescent units 304, a transparent electrode layer 305 of a first electrical conductive type, a buffer layer 306, a micro-lens array 307 and a bottom substrate 308. There is a gap between the top substrate 301 and the bottom substrate 308 that could be a glass substrate or a color filter, and the buffer layer 306 filled in the gap could be made of acrylic resin, epoxy resin or silicon. The light absorbing layer 302 located under the top substrate 301 could be made of black resin or molybdenum oxide (MoOx). The light reflective layer 303 with an aperture array comprising a plurality of apertures is located under the light absorbing layer 302, and its apertures are paired with the micro lenses comprised in the micro-lens array 307, that is, each aperture is aligned with a corresponding micro lens, so that the light penetrating the micro lenses can be focused to the apertures. The electro-luminescent units 304, such as OLED units, are located under the light reflective layer 303 with an aperture array. The light reflective layer 303 with an aperture array could be made of aluminum (Al) or aluminum-neodymium (AlNd), and it could be an anode layer or a cathode layer. The transparent electrode layer 305 of a first electrical conductive type is located under the electro-luminescent units 304 while the micro-lens array 307 is located on the bottom substrate 308, and each electro-luminescent unit includes a plurality of micro lenses. The refractive index of the micro-lens array 307 that ranges from 1.65 to 2.0 is higher than that of the buffer layer 306 that ranges from 1.5 to 1.6.

When the ambient light enters the display device from the bottom, it is preferable that each micro lens is 2~5 μm in diameter and 5~6 μm in height, each aperture is 3 μm in diameter and the gap between the top substrate 301 and bottom substrate 308 preferably is 7~10 μm within the focal length of each micro lens so that the ambient light penetrating each micro lens can be focused to its corresponding aperture. As described above, the ambient light penetrating the microlens array 307 can be focused to the apertures and substantially absorbed by the light absorbing layer 302 to increase the contrast of the display device. As demonstrated in FIG. 2B, this embodiment also enables the light radiated from the bottom-emitting surface of the electro-luminescent units 304 to be directed to the same direction to increase the luminescent intensity of the electro-luminescent units 304 and improve the contrast of the display device.

Figure 4:
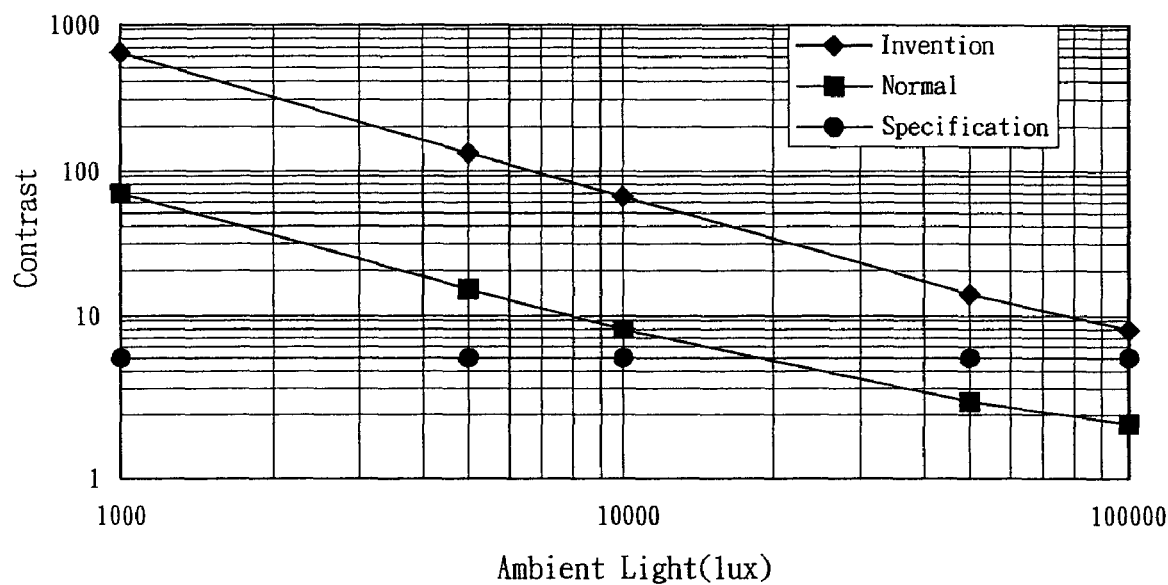
FIG. 4 shows the relationship between the contrast and the intensity of the ambient light according to the first embodiment of the present invention and the conventional display device.
Figure 5A:
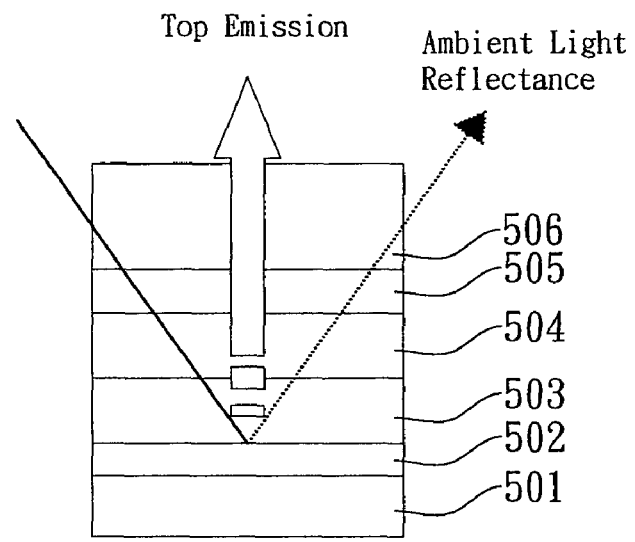
FIG. 5A is a schematic cross-sectional view showing a conventional organic light-emitting diode display device with a top-emitting surface.
Figure 5B:
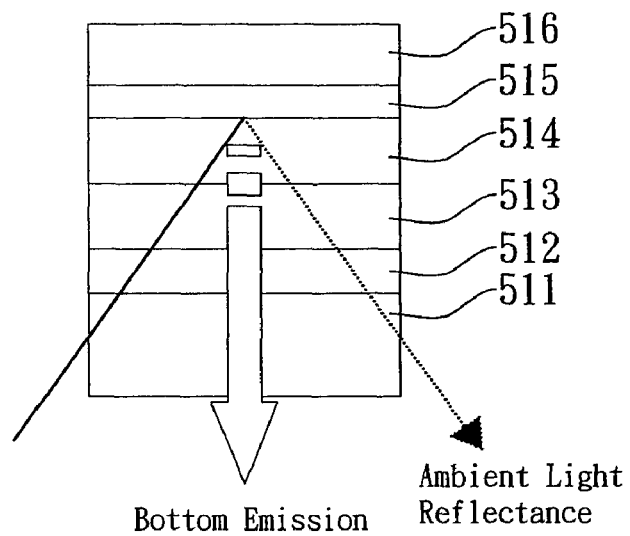
FIG. 5B is a schematic cross-sectional view showing a conventional organic light-emitting diode display device with a bottom-emitting surface.

FIG. 4 shows the relationship between the contrast and the intensity of the ambient light according to the first embodiment of the present invention and the conventional display device. The contrast of the present invention is apparently higher than that of the conventional display device under the same ambient light level. Thus it is clear that the present invention provides a better visual effect than conventional display.

As described above, the present invention adopts a micro-lens array and adds an aperture array to the reflective electrode layer to ensure that the incident ambient light can be accurately led to the apertures and absorbed by the light absorbing layer to increase the contrast of the display device. Furthermore, the micro-lens array enables the light radiated from the light-emitting surface of the electro-luminescent units to be directed to the same direction to increase the luminescent intensity of the display device and further improve the contrast.

Figure 1:
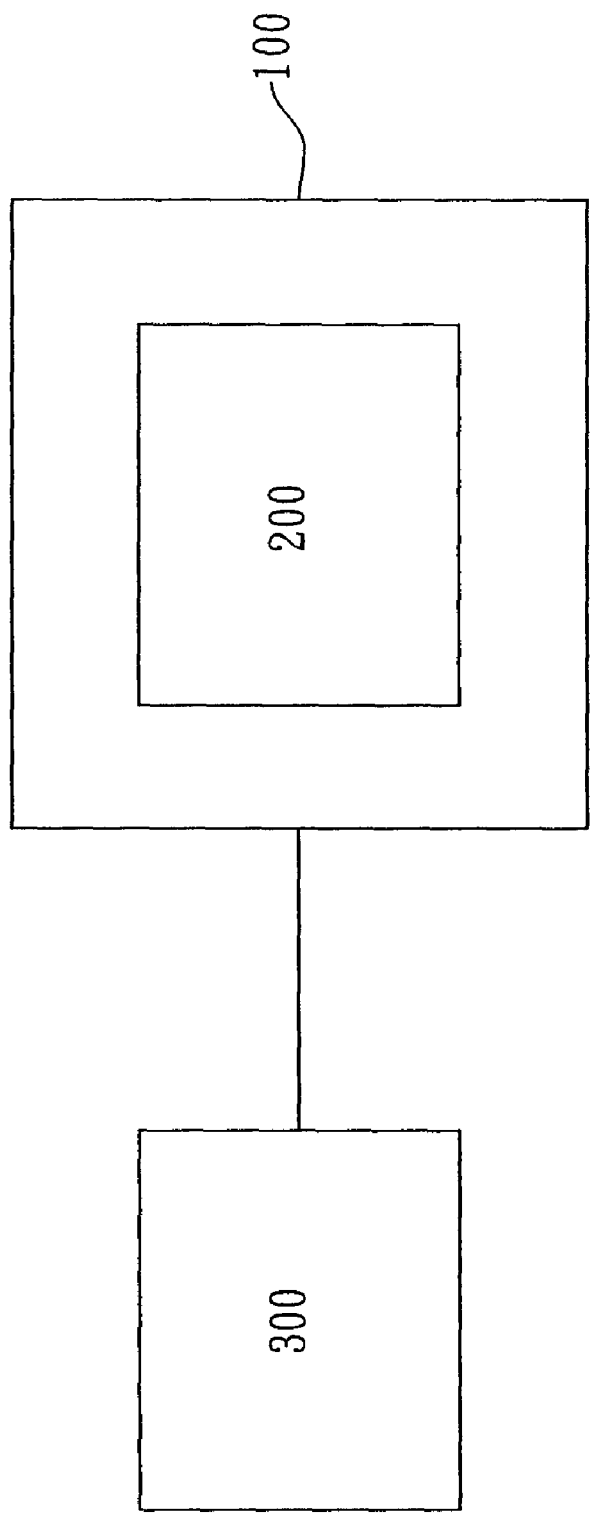
FIG. 1 is a schematic block diagram of an image display system of the present invention.

FIG. 1 is a schematic block diagram of an image display system 10. The image display system 10 comprises a display panel 100 wherein the display panel 100 comprises an organic light-emitting diode display device 200 of the present invention, and the display panel 100 could be an organic light-emitting diode display panel.

The image display system 10 generally includes a display panel 100 and an input unit 300 coupled with the display panel 100. The input unit 300 enables images to be displayed on the display panel 100 by transmitting signals. The image display system comprises a mobile phone, digital camera, PDA, notebook, desktop computer, TV, automotive display, GPS receiver, aerial display, digital photo frame or portable DVD player.

While this invention has been described by way of examples and in terms of preferred embodiments, it is to be understood that this invention is not limited hereto, and that various changes, substitutions, and alterations can be made herein without departing from the spirit and scope of this invention as defined by the appended claims.

What is claimed is:

1. An organic light-emitting diode display device, comprising:
   a first substrate;
   a second substrate separated from said first substrate by a gap;
   a buffer layer filled in said gap;
   a light absorbing layer adjacent to a surface of said second substrate opposite to said first substrate;
   a light reflective layer with an aperture array having a plurality of apertures located on said light-absorbing layer;
   a plurality of electro-luminescent units located on said light reflective layer with an aperture array;
   an electrode layer with first electrical conductive type located on said electro-luminescent units; and
   a micro-lens array comprising a plurality of micro lenses located on a surface of said first substrate opposite to said second substrate.

2. The organic light-emitting diode display device according to claim 1, wherein said light reflective layer with an aperture array has an electrical conductivity opposite to that of said electrode layer with said first electrical conductive type.

3. The organic light-emitting diode display device according to claim 1, wherein said light reflective layer with an aperture array is not electrical conductive.

4. The organic light-emitting diode display device according to claim 1, further comprising an electrode layer with a second electrical conductive type, wherein said electrode layer with said second electrical conductive type is located between said light reflective layer with an aperture array and said electro-luminescent units, and the electrical conductive of said electrode layer with said first electrical conductive type is opposite to the electrical conductive of said electrode layer with said second electrical conductive.

5. The organic light-emitting diode display device according to claim 1, wherein the apertures of said light reflective layer with an aperture array are paired and aligned with said micro lenses.

6. The organic light-emitting diode display device according to claim 1, wherein said light reflective layer with an aperture array is made of aluminium (Al) or aluminum-neodymium (AlNd).

7. The organic light-emitting diode display device according to claim 1, wherein each of the apertures of said light reflective layer with an aperture array is 2~5 μm in diameter.

8. The organic light-emitting diode display device according to claim 1, wherein a refractive index of said micro-lens array is higher than that of said buffer layer.

9. The organic light-emitting diode display device according to claim 8, wherein the refractive index of said micro-lens array ranges from 1.65 to 2.0, and the refractive index of said buffer layer ranges from 1.5 to 1.6.

10. The organic light-emitting diode display device according to claim 1, wherein each of the micro lens of said micro-lens array is 2~5 μm in diameter and 5~6 μm in height.

11. The organic light-emitting diode display device according to claim 1, wherein said light absorbing layer is made of black resin or molybdenum oxide (MoOx).

12. The organic light-emitting diode display device according to claim 1, wherein the gap between said first substrate and said second substrate is 7~10 μm.

13. The organic light-emitting diode display device according to claim 1, wherein said first substrate is a color filter or a glass substrate.

14. An image display system, comprising:
   a display device having a structure of the organic light-emitting diode display device as claimed in claim 1; and
   an input unit, which is coupled with said display device and enables images to be displayed on said display device by transmitting signals.

15. The image display system as claimed in claim 14, wherein the image display system comprises a mobile phone, digital camera, PDA, notebook, desktop computer, TV, automotive display device, GPS receiver, aerial display device, digital photo frame or a portable DVD player.

16. The organic light-emitting diode display device according to claim 1, wherein said light reflective layer with an aperture array is disposed between said electro-luminescent units and said light absorbing layer.

17. The organic light-emitting diode display device according to claim 16, wherein ambient light through said first substrate is focused by said micro-lens array through said plurality of apertures to said light absorbing layer.

18. The organic light-emitting diode display device according to claim 1, wherein said light reflective layer with an aperture array is disposed between said micro-lens array and said light absorbing layer.

19. The organic light-emitting diode display device according to claim 18, wherein ambient light through said first substrate is focused by said micro-lens array through said plurality of apertures to said light absorbing layer.

20. An organic light-emitting diode display device, comprising:

a first substrate, wherein ambient light enters through said first substrate;

a second substrate at a distance from said first substrate;

a plurality of electro-luminescent units located between said first substrate and said second substrate;

a light absorbing layer located between said second substrate and said electro-luminescent units;

a light reflective layer having an array of apertures located between said light-absorbing layer and said electro-luminescent units; and an array of micro lenses located between said first substrate and said electro-luminescent units, wherein ambient light through said first substrate is directed by said micro-lens array through said array of apertures to said light absorbing layer.

* * * * *